United States Patent [19]

Suzuki et al.

[11] 4,017,341
[45] Apr. 12, 1977

[54] METHOD OF MANUFACTURING SEMICONDUCTOR INTEGRATED CIRCUIT WITH PREVENTION OF SUBSTRATE WARPAGE

[75] Inventors: Takaya Suzuki; Akio Mimura; Seturo Yagyu, all of Hitachi; Shinji Okuhara, Fujisawa, all of Japan

[73] Assignee: Hitachi, Ltd., Japan

[22] Filed: Aug. 15, 1975

[21] Appl. No.: 604,947

[30] Foreign Application Priority Data

Aug. 19, 1974 Japan .................. 49-94183

[52] U.S. Cl. .................. 148/174; 29/577; 29/578; 29/580; 148/175; 357/49; 357/50; 357/59

[51] Int. Cl.² .................. H01L 21/20; H01L 21/76

[58] Field of Search ............ 148/174, 175; 29/577, 29/578, 580; 357/49, 50, 59

[56] References Cited

UNITED STATES PATENTS

| | | | |
|---|---|---|---|
| 3,381,182 | 4/1968 | Thornton | 357/49 |
| 3,462,650 | 8/1969 | Hennings et al. | 357/49 X |
| 3,494,809 | 2/1970 | Ross | 148/175 |
| 3,566,220 | 2/1971 | Post | 148/175 X |
| 3,721,588 | 3/1973 | Hays | 148/175 |
| 3,798,753 | 3/1974 | Camenzind et al. | 29/580 |
| 3,862,852 | 1/1975 | Kamins | 148/174 X |
| 3,925,803 | 12/1975 | Kobayashi | 357/59 X |
| 3,929,528 | 12/1975 | Davidson | 148/175 |

OTHER PUBLICATIONS

Lee, F.H., "Dielectrically Isolated Saturating Circuits", IEEE Trans. on Electron Devices, vol. ED-15, No. 9, Sept. 1968, pp. 645-650.

*Primary Examiner*—L. Dewayne Rutledge
*Assistant Examiner*—W. G. Saba
*Attorney, Agent, or Firm*—Craig & Antonelli

[57] ABSTRACT

In a monolithic semiconductor integrated circuit, when polycrystalline semiconductor is used in a portion of substrate insulatively supporting plural semiconductor single crystal regions forming circuit elements, the oxidation process of the impurity diffusion process at high temperatures and in oxygen atmosphere is started after a passivation film such as silicon oxide or silicon nitride, to prevent oxygen from diffusing or penetrating into the surface of the polycrystalline semiconductor, has been formed on the same surface. By leaving the passivation film lying on that surface during the oxidation and diffusion process warping of the substrate that may be caused due to the diffusion or penetration of oxygen into the polycrystalline semiconductor region is prevented.

8 Claims, 26 Drawing Figures

METHOD OF MANUFACTURING SEMICONDUCTOR INTEGRATED CIRCUIT WITH PREVENTION OF SUBSTRATE WARPAGE

The present invention relates to a method of making a semiconductor integrated circuit and more particularly to the method of manufacturing a substrate for use in a semiconductor integrated circuit in which plural semiconductor single crystal island regions for constituting circuit elements are rigidly supported in a semiconductor polycrystalline region.

In a semiconductor integrated circuit (referred to also as a semiconductor IC), it is necessary to separate one island region from another and all the island regions from the support region in which they are formed. This is essential because circuit elements such as transistors, diodes and resistors which are to be formed in those island regions by integrated circuit techniques, must be electrically isolated from each other. As methods of separating the island regions electrically from each other there are known the PN junction isolation, dielectric isolation, the air isolation method and a combination of these methods.

No matter which isolation technique is employed, where a polycrystalline semiconductor is used as a support region, warping or bending of the substrate consisting of semiconductor single crystal regions, semiconductor polycrystalline region and insulator due to the difference in their physical properties cannot be avoided during the manufacturing process.

The bending of the substrate degrades the accuracy in the photoetching operation, lowers the yield to a considerable extent and makes impossible the fablication of a circuit element with miniature and precise dimensions.

For example, Japanese Pat. No. 32731/70 teaches the following fact: where dielectric isolation is employed and where polycrystalline semiconductor is formed on single crystal semiconductor material through vapor growth (vapor-deposition) with a silicon oxide film as a dielectric interposed therebetween so that the excessive portion of the single crystal semiconductor may be removed to obtain single crystal island regions, the recrystallization of the polycrystalline semiconductor due to repeated heating give rise to an internal tension force that causes warping.

The warping of the substrate has two kinds of curvature. One is convex with respect to each island region and the other is convex with respect to the polycrystalline substrate and the warp mentioned in the Japanese Patent Publication can be said to have convex curvature with respect to each island region.

However, through numerous experiments to form IC's the inventors have very often found warps having convex curvatures with respect to a semiconductor polycrystalline support region, in providing a thermally grown oxide film on the semiconductor single crystal regions and in diffusion of an impurity to form a circuit element in each semiconductor single crystal island.

Therefore, after successive experiments the inventors have come to believe that the warp of the substrate is caused as follows. When the substrate is processed at a high temperature of about 1200° C in an inert gas or hydrogen gas atmosphere, no warp can be observed. Such warps take place only at high temperature in an oxygen atmosphere and the warp generated in the process does not disappear even after the grown oxide film has been removed. However, the warp is eliminated if the surface of the semiconductor polycrystalline support region is etched off. Therefore the oxygen atoms diffused into the semiconductor polycrystalline support region appear to be causative of the warp.

The crystal structure of the semiconductor polycrystalline support region is a conglomeration of single crystal semiconductor pieces in the shape of columns, each piece being grown to a diameter of 1 to several tens of $\mu m$ and since the high temperature treatment in an oxygen atmosphere causes an oxide film to be formed on the surface of the semiconductor polycrystalline support region and a great amount of oxygen atoms to rapidly diffuse into the conglomeration along the grain bundaries or the defects of crystal grains (the diffusion coefficient of oxygen is 100 – 1000 times as large as those of impurities belonging to groups III and V such as phosphorus, boron, gallium and arsenide), the surface of the semiconductor polycrystalline support region is expanded due to the expansion effect of crystal lattice resulting from the wedge-shaped local oxidations along the grain boundaries or from the high oxygen concentration in the surface of the semiconductor polycrystalline support region so that the substrate is so bent as to have curvatures concave to the island regions.

That the cause of the warp in the substrate lies in the surface of the semiconductor polycrystalline region is understood from the fact that the warp is eliminated to some extent when the surface of the polycrystalline support region is etched to a depth of 10 to several tens of micrometers.

Therefore, it is one object of the present invention to provide a method of manufacturing at high yield semiconductor IC's having a fine structure and a high precision.

Another object of the present invention is to provide a method of manufacturing semiconductor IC's in which the diffusion of oxygen into the semiconductor polycrystalline support region is prevented to eliminate the warp in the substrate.

A further object of the present invention is to provide a method of manufacturing semiconductor IC's which are free from warps in the substrate even if they use various kinds of isolation having polycrystalline support.

In accordance with the present invention, there is provided a method of manufacturing a semiconductor IC having a substrate consisting of plural semiconductor single crystal island regions in which circuit elements are formed; a semiconductor polycrystalline support region which supports the island regions; and insulating provided between the island regions themselves and between the island regions and the support region, comprising the steps of forming a passivation film to prevent oxidation and the diffusion and penetration of oxygen on said support region before said support region is subjected to any high temperature treatment in oxygen atmosphere and of leaving the passivation film on the surface of said support region throughout the high temperature treatment as it is.

Other objects, features and advantages of the present invention will be apparent from the following description of the specification furnished with the drawings, in which:

Now, the present invention will be described by way of the embodiment with the aid of the attached drawings.

As is shown in FIG. 1, an n-type silicon single crystal wafer 11 having a predetermined resistivity is used as a starting material. A desired pattern is formed through etching and an insulating silicon oxide film 12 is formed over the entire surface through CVD or thermal-oxidation method. Next, as shown in FIG. 1b, a semiconductor layer 13 is formed through vapor phase growth method on the patterned face of the silicon single crystal wafer 11. The semiconductor layer 13, since this is formed on the silicon oxide layer 12, is usually not of single crystal material but is polycrystalline. After the thickness of the deposited semiconductor layer 13 has reached a predetermined value, the single crystal wafer 11 and the polycrystalline semiconductor layer 13 are etched or polished to the levels indicated by broken lines A and B, so that a substrate 14 having flat upper and lower surfaces is obtained as shown in FIG. 1c. The substrate 14 thus formed has such a structure that plural semiconductor (silicon) single crystal island regions 17 electrically isolated from one another are provided in semiconductor (silicon) polycrystalline support region 15 with a silicon oxide film 16 interposed therebetween.

Figure 1A:
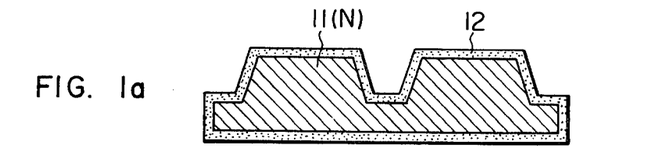
FIGS. 1a to 1f illustrate, in the cross section of a substrate, the successive steps of the manufacturing process according to the present invention as applied to a dielectrically isolated substrate based on the single-poly process.
Figure 1B:
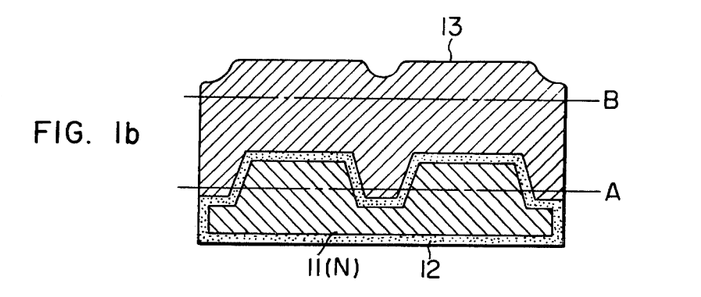
Figure 1C:
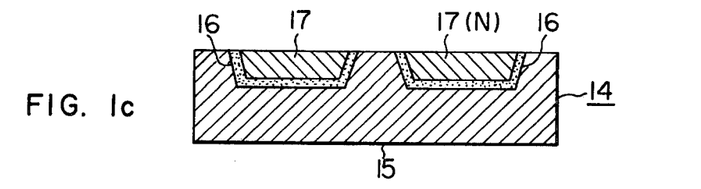
Figure 1D:
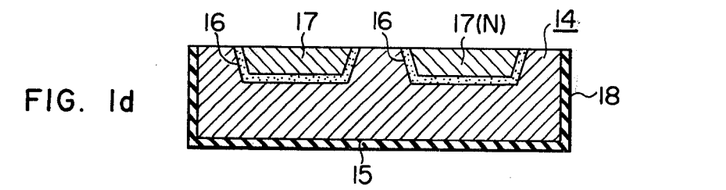

As is shown in FIG. 1d, on that surface of the silicon polycrystalline support region 15 which carries no island regions 17 of silicon single crystal there is formed a passivation film 18, according to the present invention, for preventing the diffusion and penetration of highly concentrated oxygen atoms into the support regions 15 through the grain bundaries of the region 15.

Such materials which do not adversely affect the circuit elements formed in the silicon single crystal island regions 17, e.g. a silicon nitride film, a tantalum pentoxide film, an alumina film or a silicon oxide film which is formed through vapor phase chemical reaction at low temperature below 800° C where the diffusion of oxygen into silicon hardly occurs, may be used as the passivation film 18.

Now, the substrate for use in a semiconductor IC has been completely prepared.

Figure 1E:
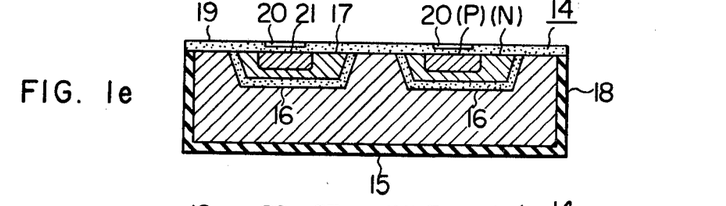

A silicon oxide film 19 is formed on the silicon single crystal island regions 17, as shown in FIG. 1e, to form in the island regions 17 in the substrate 14 such circuit elements as thyristors, transistors, diodes or resistors. By forming a oxide film 19 through a thermal-oxidation method, a silicon oxide film is formed also on the upper surface of the silicon polycrystalline support region 15 which is absent the passivation film 18.

Figure 1F:
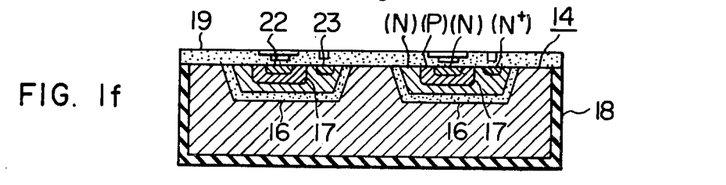

In the case of forming a transistor, for example, an opening 20 is cut in the silicon oxide film 19 and p-type impurity is diffused in a high temperature oxygen atmosphere to form a base region 21, as shown in FIG. 1e. Through similar processes of an diffusing n-type impurity, an emitter region 22 and a collector contact region 23 are formed in the substrate 14 as shown in FIG. 1f.

Thereafter, a desired IC is completed by forming electrical wiring necessary for constituting a desired configuration.

Since the passivation film 18 is used to prevent the high concentration diffusion of oxygen into the silicon polycrystalline support region 15 or its oxidation, which are causative of the warp of the substrate 14, then film 18 must be formed on the surface of the silicon polycrystalline support region 15 before any heating treatment whatever in an oxygen atmosphere and it must not be removed until all the heating treatments in an oxygen atmosphere have been finished.

This requirement is essential since according to the teaching of the present invention, without the passivation film 18, even the last heating treatment in an oxygen atmosphere would cause oxygen to diffuse and penetrate at a high concentration into the silicon polycrystalline support region 15 and the substrate 14 would be bent due to the above described expansion effect.

In the preceding description, a silicon oxide film formed through a vapor phase chemical reaction has been described as an example of the passivation film 18, and the usefulness of this silicon oxide film lies in that the oxidation of the support region 15 and the diffusion and penetration of oxygen into the support region 15 hardly take place in a low temperature heating treatment in an oxygen atmosphere and that the once oxidized silicon is stable, that is, it cannot be reduced even at temperatures near 1100° C, so that the silicon oxide film cannot act as a source of oxygen diffused into the region 15.

The materials for the passivation film 18 are chosen in view of the following points. The selected materials should have thermal expansion coefficients approximating that of the silicon polycrystalline support region 15 so that the warp of the substrate 14 due to thermal stresses generated in the heating process such as thermal oxidation or impurity diffusion mentioned above may not be caused and that the substrate 14 may be free from cracks due to the thermal stress, which cracks give rise to the local diffusion and penetration of oxygen into the substrate.

In the step of FIG. 1e, the upper surface of the silicon polycrystalline support region 15 is allowed to be oxidized. The entire part of the upper surface is not oxidized and the area of exposed portions is very small so that the substrate 14 is hardly warped.

The manufacturing process shown in FIGS. 1a to 1f is based on the method called the single-poly process in which the silicon polycrystalline support region 15 is provided on one side of the silicon single crystal wafer 1 and is disclosed in D. Mc Williams, C. Fa, G. Lachian and O. Maxwell, Jr: J. Electrochem. Soc., 111, p153c (1964). The present invention can be applied equally to other methods such as double-poly process, selective etch and refill process and positive channel isolation process.

Now, the present invention will be described as applied to the double-poly process in which silicon polycrystalline support regions are provided on both the sides of a silicon single crystal wafer and is disclosed in G. L. Schnable, A. F. McKelney and J. A. Hastings: Electrochem. Tech., 4, p57 (1966).

Figure 2A:
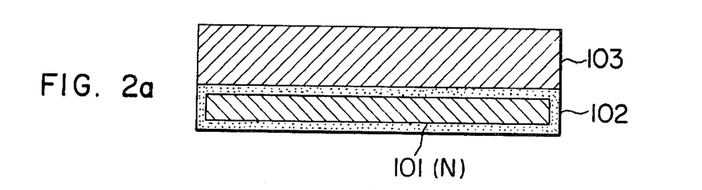
FIGS. 2a to 2f illustrate, in the cross section of a substrate, the successive steps of the manufacturing process according to the present invention as applied to a dielectrically isolated substrate based on the double-poly process.

As shown in FIG. 2a, a first silicon polycrystalline support region 103 is grown through vapor phase growth on the silicon oxide film 102 obtained by oxidizing a silicon single crystal wafer 101. The lower portion of the silicon oxide film 102 is partially removed and grid-shaped grooves 104 are cut in the silicon single crystal wafer 101 through selective etching so that the upper portions of the silicon oxide film 102 may be exposed.

Figure 2B:
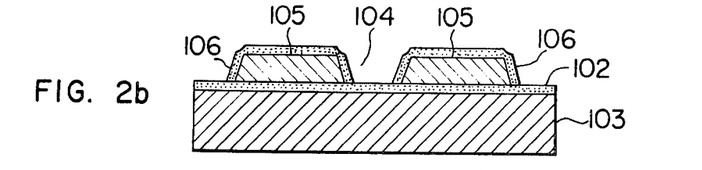

The grid-shaped grooves divide, as shown in FIG. 2b, the silicon single crystal wafer 101 into many island regions 105 separated from one another and the silicon polycrystalline support region 103 serves to fix the island regions 105 to their predetermined positions. This is a remarkable difference in the fabricating process from the single-poly process whose steps of process are shown in FIGS. 1a to 1f.

Figure 2C:
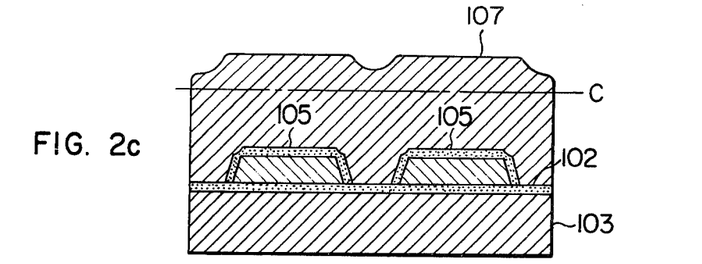
Figure 2D:
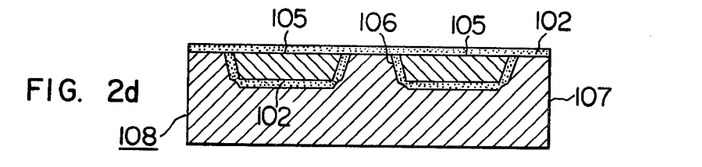

After oxide films 106 have been formed through, for example, a thermal oxidation method on the peripheral side surface of each island region 105, a second silicon polycrystalline support region 107 is grown through vapor phase growth on the island regions 105 as shown in FIG. 2c. The second silicon polycrystalline support region 107 is polished down to the level indicated by the broken line in FIG. 2c and then the first support region 103 is removed through a suitable treatment such as etching or polishing, so that a dielectrically isolated substrate 108 is obtained as shown in FIG. 2d.

Figure 2E:
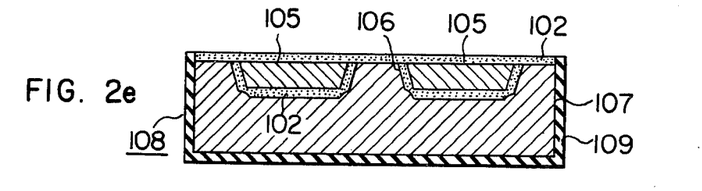

A passivation film 109, which is the gist of the present invention, is formed on the entire surface of the second support region 107 so as to prevent the oxidation and the diffusion and penetration of oxygen, as shown in FIG. 2e.

Figure 2F:
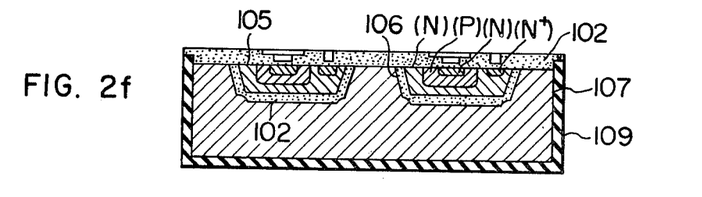

Thereafter, predetermined circuit elements are formed through, for example, diffusion techniques in the island regions 105 of silicon single crystal provided in the substrate 108, as shown in FIG. 2f. The second support region 107 of polycrystalline silicon has the passivation film 108 formed thereon so that no warp due to oxygen is caused in the substrate 108 and so that a semiconductor IC having predetermined circuit elements with high accuracy can be obtained.

The present invention will now be described as applied to the selective etch and refill process, which is dislosed in R. L. Petritz: Trans. Met. Soc. AIME, 236, p235 (1966).

Figure 3A:
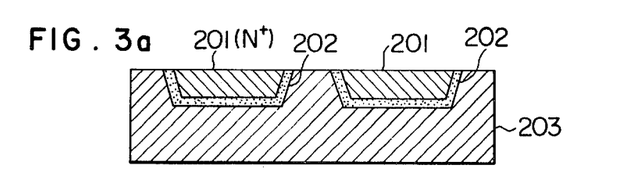
FIGS. 3a to 3e illustrate, in the cross section of a substrate, the successive steps of the manufacturing process according to the present invention as applied to a dielectrically isolated substrate based on the selective etch and refill process.

This method is an improved version of the single-poly process whose steps of process are illustrated in FIGS. 1a to 1f, in which a heavily impurity-doped n-type silicon single crystal wafer is used. The steps shown in FIGS. 1a to 1c apply directly this case and these equivalent steps are omitted here. FIG. 3a corresponds, however, to FIG. 1c, in which silicon single crystal regions 201 are insulatively supported in a silicon polycrystalline support region 203 with silicon oxide films 202 therebetween.

Figure 3B:
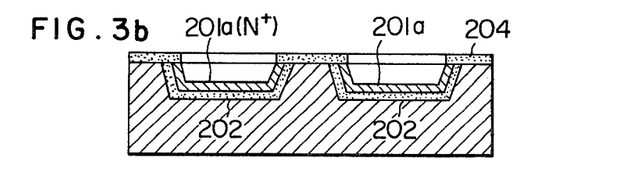

As shown in FIG. 3b, a mask 204 is provided on the silicon single crystal regions 201 and the single crystal regions 201 are etched down to a predetermined depth. If the mask 204 is of a silicon oxide film, a silicon layer 205 with an impurity doped lightly thereinto is grown through vapor phase growth while the silicon oxide mask is left as it is.

The silicon layer 205 grown on the silicon oxide film 204 becomes a polycrystalline region 205a but the same layer 205 on the silicon single crystal region 201a becomes a single crystal region 205b.

Figure 3C:
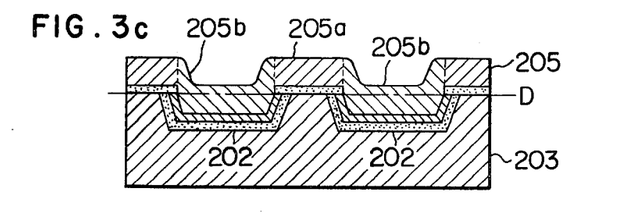
Figure 3D:
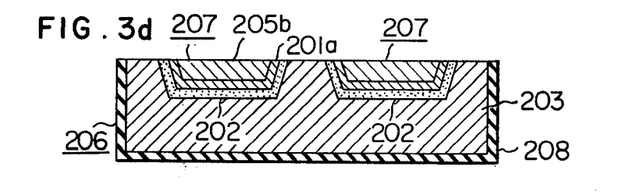

The silicon layer 205 inclusive of the silicon oxide film 204 is polished to the level D indicated by broken line in FIG. 3c and a substrate 206 as shown in FIG. 3d can be obtained.

Each of silicon single crystal island regions 207 consists of a high impurity concentration region 201a and a vapor phase grown region 205b.

Figure 3E:
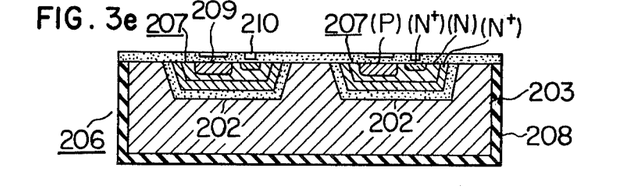

Since the growth of the silicon layer 205 is not performed in an oxygen atmosphere, no passivation film has yet been provided. A passivation film 208 is now provided, as shown in FIG. 3d, on the surface of the silicon polycrystalline support region 203 before the formation of predetermined circuit elements in island regions 207. Thereafter, through the well known selective diffusion techniques, p-type impurity diffused regions 209 and heavily impurity-doped n-type regions 210 are formed to form diodes in the island regions 207, as shown in FIG. 3e.

The present invention will be described below as applied to the positive isolation process which is disclosed in U.S. Davidson and F. Lee: Proc. IEEE. 57, p1532 (1969). This process is a variation of the double-poly process shown in FIGS. 2a to 2f and since the grooves are cut from the same side as the surface of the impurity diffusion for masking circuit elements, the mask used for groove etching is a "positive" pattern rather than the mirror-image mask used in standard single-poly process.

Figure 4A:
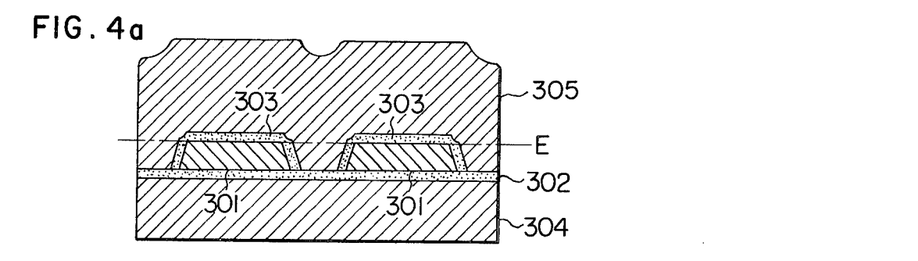
FIGS. 4a to 4d illustrate, in the cross section of a substrate, the successive steps of the manufacturing process according to the present invention as applied to a dielectrically isolated substrate based on the positive channel isolation process.

The steps shown in FIGS. 2a to 2c apply directly to this case and FIG. 4a corresponds to FIG. 2c. As shown in FIG. 4a, n-type silicon single crystal island regions 301 are supported via silicon oxide films 302 and 303 between a first and a second silicon polycrystalline support regions 304 and 305.

In the positive isolation method, different from the double-poly process in which the second silicon polycrystalline region is used as support region, the first silicon polycrystalline region 304 is used as support region and the second silicon polycrystalline support region 305 is polished down to the level E indicated by broken line in FIG. 4a.

Figure 4B:
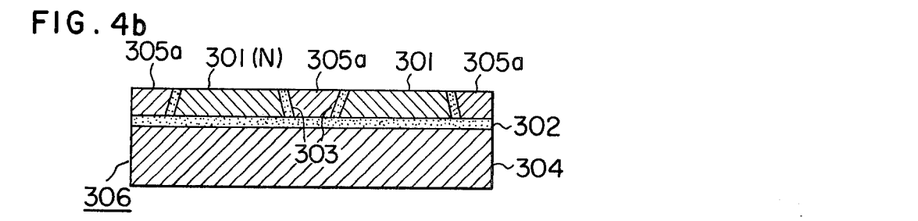

The thus prepared substrate 306 is as shown in FIG. 4b. The portion 305a of the second support region 305 left after the polishing step serves as a support region filling the grid-shaped grooves separating the silicon single crystal island regions 301 from one another.

Figure 4C:
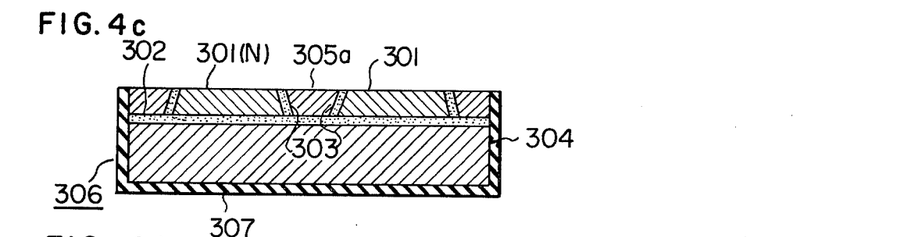

A passivation film 307, which is the gist of the present invention, is then provided on the support regions 304 as shown in FIG. 4c.

Figure 4D:
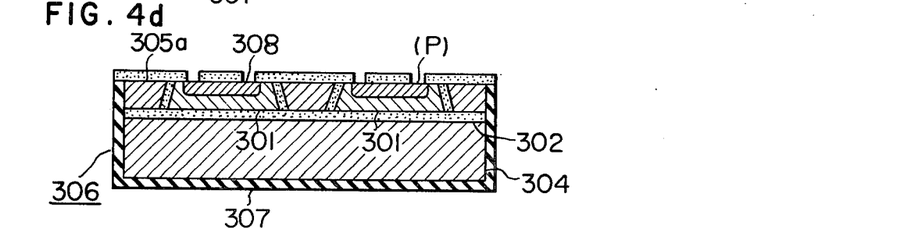

Finally, through the use of selective diffusion in an oxygen atmosphere, as shown in FIG. 4d p-type impurity regions 308 are formed to form resistors in the island regions 301.

The previous embodiments are concerned with the method of manufacturing semiconductor IC's according to the dielectric isolation, but in the following the present invention will be described as applied to semiconductor IC's according to air isolation techniques.

Figure 5A:
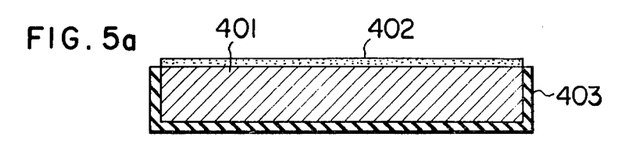
FIGS. 5a to 5e illustrate, in the cross section of a substrate, the successive steps of the manufacturing process according to the present invention as applied to an air isolated substrate.

At first, as is shown in FIG. 5a, a polycrystalline semiconductor (silicon) wafer 401 is prepared to be used as a support region and then a silicon oxide film 402 is formed on one of the principal surfaces of the wafer 401 through a low temperature vapor phase chemical reaction while on the remaining surface of the wafer 401 there is formed a passivation film 403 for preventing the oxidation and the diffusion and penetration of oxygen, which film is the gist of the present invention.

If a silicon oxide film is used as such a passivation film, the silicon oxide film can be formed simultaneously with the deposition of the material of the silicon oxide film 402. On the other hand, if the silicon oxide film 402 and that of the passivation film 403 are different from each other, the order of forming the films 402 and 403 may be arbitrary.

Figure 5B:
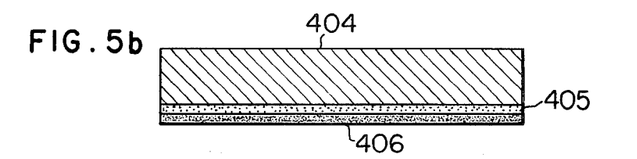

As is shown in FIG. 5b, an n-type silicon single crystal wafer 404 having a predetermined resistivity is separately prepared. A silicon oxide film 405 is formed through suitable techniques on one of the principal surfaces of the wafer 404 and an adhesive 406 such as phospho-silicate glass or boro-silicate glass, which has a melting point lower than those of the silicon polycrystalline wafer 401, the silicon oxide films 402 and 405, the passivation film 403 and the silicon single crystal wafer 404 and which has a thermal expansion coefficient approximating to those of the above mentioned parts, is applied on the silicon oxide film 405.

Figure 5C:
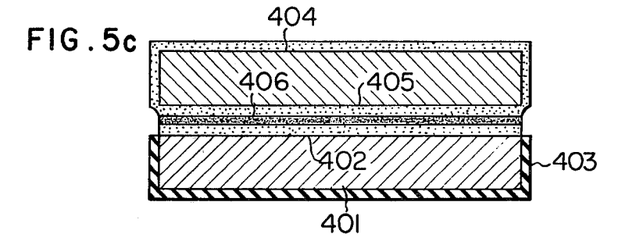

Then, as shown in FIG. 5c, the silicon polycrystalline wafer 401 and the silicon single crystal wafer 404 are stacked one upon another, with the silicon oxide film 402 and the adhesive 406 brought in contact with each other, and the adhesive 406 is fused by heating the stacked assembly up to 1000° to 1200° C for a very short time and then cooled down to make the assembly integrated. In this stage, the silicon polycrystalline wafer 401 has the passivation film 403 formed thereon so that the oxidation of the wafer 401 and the diffusion and penetration of oxygen into the wafer 401 are prevented even in the heating treatment in oxygen atmosphere.

Figure 5D:
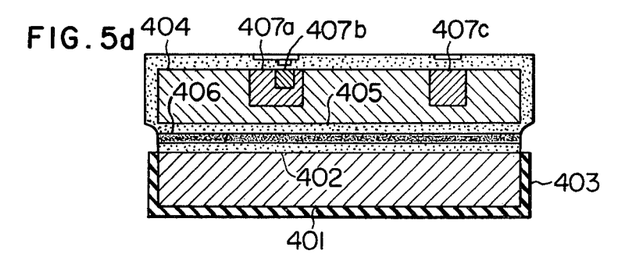

After the silicon single crystal wafer 404 has been rigidly fixed onto the silicon polycrystalline wafer 401, the upper surface of the wafer 404 is polished and cleansed and p-type and n-type impurities are diffused, as shown in FIG. 5d, to form desired impurity diffused regions 407a – 407c. The diffusion processes performed here on the plural parts of the upper surface of the wafer 404 may take place simultaneously or sequentially along with the well known techniques such as etching or surface inactivation treatment, sometimes in an oxygen atmosphere.

Figure 5E:
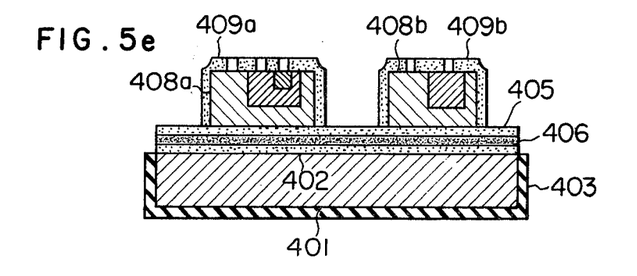

Through a photoresist method, the silicon single crystal wafer 404 is etched away down to the silicon oxide film 405, as shown in FIG. 5e, with the portions containing the diffused regions 407a – 407c remaining. The portions which serve as circuit elements are isolated from one another, like so many islands and the semiconductor single crystal island regions 408a and 408b have their surfaces covered respectively with insulative and stable passivation films 409a and 409b. Openings are cut in the passivation films 409a and 409b to attach metal leads to the circuit elements. After electrical wiring, a semiconductor IC is completed.

As described above, according to the present invention, passivation films for preventing the oxidation and the diffusion and penetration of oxygen are provided on the surface of the semiconductor polycrystalline support region before any high temperature treatment in a oxygen atmosphere and even if the single crystal island regions are subjected to any high temperature treatment in an oxygen atmosphere, the substrate will never be warped. Accordingly, the photoresist treatment of the semiconductor device can be performed with high precision and the resultant IC's can have a high density, a high accuracy and a high yield.

In the above embodiments, the present invention is described as applied to the process of manufacturing semiconductor IC's having dielectric isolation and air isolation, but it will be needless to say that the present invention can be applied also to other various types of isolation in which at least one semiconductor polycrystalline support region is used.

Moreover, the passivation film need not be provided directly on the semiconductor polycrystalline support region, but it may be provided on, for example, a vapor-deposited metal layer formed to ground the support region or another members may be provided on the passivation film. Furthermore, impurity atoms may be diffused heavily into the surface of the support region so that an electrode to be grounded may be formed.

What we claim is:

1. In a method of manufacturing a semiconductor integrated circuit wherein a plurality of monocrystalline semiconductor regions are formed in a polychrstalline semiconductor support substrate and wherein insulating material is formed between said island regions and said substrate to isolate said regions from each other and from said support substrate, and wherein circuit elements are formed in said island regions in an oxygen atmosphere at such high temperatures which would ordinarily subject said support substrate to warping resulting from the oxidation and the introduction of oxygen into said substrate, the improvement comprising the step of
a. preventing the warping of said support substrate resulting from the oxidation and the introduction of oxygen into said substrate during the formation of said circuit elements by
   a1. initially forming a passivation film on those surfaces of said support substrate which would otherwise be exposed to said oxygen atmosphere and said such high temperatures prior to the carrying out of steps in which said oxygen atmosphere and said such high temperatures are employed for the formation of said circuit elements, and
   a2. retaining said initially formed passivation film on said surfaces of said support substrate during the performance of those steps in which said oxygen atmosphere and said such high temperatures are employed for the formation of said circuit elements, to thereby prevent the unwanted warping of said support substrate due to the oxidation and introduction of oxygen into said support during the formation of said circuit elements.

2. The improvement according to claim 1, wherein said passivation film is made of a material selected from the group consisting of silicon nitride, tantalum pentoxide, alumina, and silicon oxide which grown by a vapor phase chemical reaction at a temperature below 800° C.

3. The improvement according to claim 1, wherein the coefficient of thermal expansion of said passivation film approximates that of said support substrate.

4. The improvement according to claim 1, wherein said monocrystalline island regions are formed in one principal surface of said polycrystalline semiconductor support substrate and said step (a1) comprises the step of forming said passivation film on the other principal surfaces of said support substrate.

5. In method of manufacturing a semiconductor integrated circuit which includes the steps of
   a. cutting grid-shaped grooves in one of the principal surfaces of a silicon single crystal wafer;
   b. forming a silicon oxide film on at least said one of the principal surfaces of said wafer;
   c. growing, through vapor phase, a polycrystalline silicon support region on the silicon oxide film which has been formed on said wafer;
   d. polishing the other principal surface of said wafer so that said grid-shaped grooves may be exposed, said grooves separating said wafer into plural single crystal silicon island regions isolated from one another; and
   e. forming circuit elements in said island regions in an oxygen atmosphere and at such high temperatures which would ordinarily subject said polycyrstalline silicon support region to warping due to the oxidation and the introduction of oxygen into said support region,
   the improvement comprising the steps of
   i. forming, subsequent to step (d) but prior to step (e), a passivation film on those surfaces of said support region other than the surface thereof wherein said island regions are provided, which would otherwise be exposed to said oxygen atmosphere and said such high temperatures during step (e); and
   ii. retaining said passivation film on said support region during step (e), to thereby prevent the unwanted warping of said support region due to the oxidation and introduction of oxygen into said support region during the formation of said circuit elements.

6. In a method of manufacturing a semiconductor integrated circuit which includes the steps of:
   a. growing, through vapor phase, a first silicon polycrystalline region on a silicon oxide film provided on one principal surface of a silicon single crystal wafer;
   b. etching a predetermined portion of said wafer from the other principal surface thereof until said silicon oxide film is exposed, in order to form grid-shaped grooves by way of which said silicon oxide is exposed, said grid-shaped grooves separating said wafer into a plurality of monocrystalline island regions;
   c. forming silicon oxide on the exposed surfaces of said island regions;
   d. growing, through vapor phase, a second silicon polycrystalline support region on the silicon oxide-covered monocrystalline island regions;
   e. completely removing said first silicon polycrystalline support region; and
   f. forming circuit elements in said island regions in an oxygen atmosphere and at such high temperatures which would ordinarily subject said second silicon polycrystalline support region to warping resulting from the oxidation and the introduction of oxygen into said second support region;
   the improvement comprising the steps of:
   i. forming, subsequent to step (e) but prior to step (f), a passivation film on those surfaces of said second support region other than the surface thereof wherein said island regions are provided, which would otherwise be exposed to said oxygen atmosphere and said such high temperatures during step (f); and
   ii. retaining said passivation film on said second support region during step (f), thereby prevent the unwanted warping of said second support region due to the oxidation and introduction of oxygen into said second support region during the formation of said circuit elements.

7. In a method of manufacturing a semiconductor integrated circuit which includes the steps of;
   a. growing, through vapor phase, a first silicon polycrystalline support region on a silicon oxide film provided on one principal surface of a silicon single crystal wafer;
   b. etching a predetermined portion of said wafer from the other principal surface thereof until said silicon oxide film is exposed, in order to form grid-shaped grooves by way of which said silicon oxide is exposed, said grid-shaped grooves separating said wafer into a plurality of monocrystalline island regions;
   c. forming silicon oxide on the exposed surfaces of said island regions;
   d. growing, through vapor phase, a second silicon polycrystalline support region on the silicon oxide-covered monocrystalline island regions,
   e. polishing said second support region until said island regions are exposed; and
   f. forming circuit elements in said island regions in an oxygen atmosphere and at such high temperatures which would ordinarily subject said first support region to warping due to the oxidation and the introduction of oxygen into said first support region;
   the improvement comprising:
   i. forming, subsequent to step (e) but prior to step (f), a passivation film on those surfaces of said first support region other than the surface thereof whereon said island regions are provided, which would otherwise be exposed to said oxygen atmosphere and such high temperatues during step (f); and
   ii. retaining said passivation film on said first support region during step (f), to thereby prevent the unwanted warping of said first support region due to the oxidation and introduction of oxygen into said first support region during the formation of said circuit elements.

8. A method of manufacturing a semiconductor integrated circuit comprising the steps of:
   a. forming an oxygen-impervious passivation film on those surfaces of a silicon polycrystalline support region, having an insulating film provided on one principal surface thereof, other than said one principal surface of said support region;
   b. affixing a monocrystalline silicon wafer having an insulating layer on one surface hereof to said insulating film of said support region, by way of said insulating layer;
   c. forming a plurality of circuit elements in prescribed portions of said wafer in an oxygen atmosphere and at such high temperatures which would ordinarily, but for said oxygen-impervious passivation film, subject said those surfaces of said support region to oxidation and the introduction of oxygen thereinto, thereby causing warping of said support region; and d. forming grid-shaped grooves in selected portions of said wafer between said prescribed portions thereof, the bottoms of said grooves reaching said insulating layer, so as to insulatingly separate from one another plural island regions of monocrystalline silicon in which said circuit elements are formed.

* * * * *